(12) United States Patent
Blednov

(10) Patent No.: US 8,410,853 B2
(45) Date of Patent: Apr. 2, 2013

(54) INDUCTIVE CIRCUIT ARRANGEMENT

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 37 days.

(21) Appl. No.: 12/791,589

(22) Filed: Jun. 1, 2010

(65) Prior Publication Data

US 2011/0291772 A1    Dec. 1, 2011

(51) Int. Cl.
   *H03F 3/68*    (2006.01)
(52) U.S. Cl. .................................. 330/295; 330/124 R
(58) Field of Classification Search .............. 330/124 R, 330/295
   See application file for complete search history.

(56) References Cited

U.S. PATENT DOCUMENTS

| | | | |
|---|---|---|---|
| 6,177,834 | B1 | 1/2001 | Blair et al. |
| 6,737,948 | B2 * | 5/2004 | Aoki et al. ................... 336/200 |
| 7,053,706 | B2 * | 5/2006 | Kwon et al. .............. 330/124 R |
| 7,078,976 | B2 | 7/2006 | Blednov |
| 7,276,420 | B2 * | 10/2007 | Liu et al. ...................... 438/329 |
| 7,939,864 | B1 | 5/2011 | Blednov |
| 2004/0147219 | A1 | 7/2004 | Noritake |
| 2009/0212858 | A1 | 8/2009 | Blednov |

FOREIGN PATENT DOCUMENTS

| | | |
|---|---|---|
| WO | 2006003608 A1 | 1/2006 |
| WO | 2009027916 A2 | 3/2009 |

OTHER PUBLICATIONS

J. Hagerheiden, M. Ciminera and G. Jue, "Improved Planar Spiral Transformer Theory Applied to a Miniature Lumped part Quadrature Hybrid", MTT, Apr. 1997, pp. 543-545.
W. H. Doherty, "A New High Efficiency Power Amplifier for Modulated Waves," Proceed-ings of the Institute of Radio Engineers, vol. 24, No. 9, Sep. 1936.
Himanshu Khatri, et al., "Integrated RF Interface Supression Filter design Using Bond-Wire Inductors," IEEE Transaction on Microwave Theory and Techniques, vol. 55, pp. 1024-1034, No. 5, May 1, 2008.

* cited by examiner

*Primary Examiner* — Robert Pascal
*Assistant Examiner* — Khiem Nguyen

(57) ABSTRACT

A bond wire circuit includes at least three bond wires arranged to split an input signal into two output signals. In connection with various example embodiments, bond wires are arranged in a generally parallel manner to mitigate magnetic coupling and related issues for splitting an input signal and providing each of split signals to an amplifier. The bond wires are connected by capacitive circuits that facilitate the splitting, and in some applications, additional capacitive (to ground/reference) and load circuits to further facilitate the splitting of the input signals for specific amplifier circuit implementations, and applications to various loads. In some implementations, the input signals are split in equal or arbitrary portions with frequency independent phase differences in a wide frequency band, with isolation between ports of the circuit.

22 Claims, 7 Drawing Sheets

INDUCTIVE CIRCUIT ARRANGEMENT

A variety of input circuits suffer from undesirable characteristics, particularly relative to compact size and efficiency, and as relative to certain applications requiring or benefitting from input isolation. Such input circuits can be used to provide an input to a variety of components, such as amplifiers that are used in radio frequency circuits.

Amplifiers for a variety of applications, including high-power MMIC amplifiers such as those used in mobile communications base stations, have seen significant growth. For these amplifiers, high power efficiency and small size are desirable, yet these aspects have been difficult to achieve. Generally, higher-power amplifiers are larger, and reducing the size of components can restrict the power capabilities. In addition, high power devices used for such amplifiers must generally exhibit very high power efficiency (e.g., >70%) at power gain no less than 16 dB, while MMIC semiconductor material such as Si LDMOS has undesirably high radio frequency (RF) losses.

The Doherty amplifier type has become a technology of choice in recent years for transmitters of 3G/4G handsets and mobile base stations, and for a variety of applications due to its high performance and relatively simple architecture. The use of the Doherty technique facilitates maintaining the efficiency of the power amplifier across a wide range of input power variation. The Doherty amplifier was first suggested by W. H. Doherty in 1936 and is discussed in a technical paper entitled "A New High Efficiency Power Amplifier for Modulated Waves," W. H. Doherty, Proceedings of the Institute of Radio Engineers, Vol. 24, No. 9, September 1936.

The use of LDMOS technology for Doherty amplifier MMIC in the final stages of mobile BTS (Base Transceiver Stations) transmitters is desirable due to high performance at low cost. However, it is difficult to achieve low size via LDMOS assembly equipment/design rules. For example, many LDMOS design limitations involve limits on spacing between bond wires to 130 microns or greater, which results in a generally low magnetic coupling factor (k, e.g., of about 0.38). In addition, power devices having variable input impedances, which is often the case for the peak amplifier in a Doherty amplifier circuit, lead to amplitude and phase deviation depending on the power level. This can be detrimental for systems such as Wideband Code Division Multiple Access (WCDMA) communication systems. Furthermore, the variable input impedances lead to power reflections from the input of the power devices operating in the peak and main amplifiers in such systems, and thus result in an undesirable mutual influence or coupling effect between (e.g., main and peak) devices/amplifiers.

A highly doped volume of substrate beneath an episilicon layer in silicon substrates of MOS and LDMOS devices is commonly used as a ground plane. Such a substrate demonstrates different losses depending on doping concentration and frequency of operation, resulting in different RF loss mechanisms including those related to "Skin effect mode", "Slow wave mode" and "Dielectric quasi-TEM mode" of propagations.

For Doherty amplifiers, these MOS/LDMOS devices can be used as the carrier (or main) and peak amplifiers to provide desirable operation and linearity, but both power devices are operating in different modes (e.g., the main amplifier in AB-class and the peak amplifier in C-class), which causes large differences in power gain. Thus, the Doherty amplifier exhibits a power range in which the gain starts to decrease and thus introduces output amplitude modulations based on overall Doherty amplifier gain deviation (i.e., AM-AM distortions) due to the fact that the peak amplifier operating in C-class has a lower gain and the load impedance at the main amplifier output drops due to the Doherty principles.

An important bottleneck with the implementation of Doherty amplifiers is operational frequency bandwidth, caused by several different components including: a) parasitic output capacitance of power device, b) input and output impedance transformers, and c) output 90° impedance inverter (or Doherty combiner).

According to Bode-Fano theory (equation below), the operational bandwidth $\Delta\omega$ of a power transistor having output parasitic capacitance Cds and optimal impedance $R_L$ at output reflection coefficient $\Gamma$ is limited to:

$$\int_{\omega_1}^{\omega_2} \ln\left(\frac{1}{\Gamma}\right) d\omega = \omega_2 - \omega_1 = \Delta\omega = \frac{1}{RC} = \frac{1}{R_L C_{ds}}$$

The impedance transformation networks affect operational frequency band too, and the higher the transformation ratio, the more the frequency band is limited. So, if a power device with an output impedance of $Z_{out}$ is being matched to a load $Z_{load}$ by a quarter wave impedance transformer with characteristic impedance Ztr, then depending on the phase shift $\theta$ of the transformer, the achievable reflection coefficient $\Gamma$ can be expressed by:

$$|\Gamma| = \frac{\frac{Z_L}{Z_0} - 1}{2\sqrt{\frac{Z_L}{Z_0}}} \cos\theta$$

Considering the traditional Doherty amplifier design, required impedance transformation ration is high. For example a 150 W device operating as a Main amplifier at 28V supply needs an output impedance transformation ratio up to 50 times (e.g., from 1 Ohm to 50 Ohm). A valuable parameter of such a Main amplifier in the Doherty system is power efficiency. If acceptable loss of power efficiency due to load mismatch is around 1%, then reflection coefficient has to be <0.1, and return loss <−20 dB. The corresponding operational frequency band is <150 MHz at 2.2 GHz, which is about 7% of relative bandwidth. For a Doherty amplifier having only a lumped element Doherty combiner (without impedance transformers), the operational frequency band is about 30% of relative bandwidth.

Another bottleneck of the Doherty amplifier results from difference of phase frequency response of Doherty combiner and input network providing a 90° phase shift between the input of Main and Peak devices, which introduces additional limits to the frequency band of operation.

Another challenge to the implementation of Doherty amplifiers relates to the amplitude frequency response of the input networks to which an amplifier is coupled, as the power level and frequency response can be undesirable or otherwise problematic. Approaches to providing different power levels and a flat frequency response of drive signals for Main and Peak devices in an operational frequency band have been challenging to implement. For instance, power division networks having a 90 degree phase shift and port isolations (a so called Hybrid coupler network) can be used, but are difficult to implement on substrates such as an LDMOS substrate using a standard integration process while maintaining signal loss to a low level. Other approaches, such as using magnetically coupled bond wires, are not feasible due to equipment and assembly processes and required bond wire proximity.

Other connectivity approaches suffer from undesirable (insufficient) magnetic coupling. In addition, manufacturing devices to set or address magnetic coupling issues in a consistent manner can be challenging for a variety of manufacturing processes. For instance, minimal distances between components such as bond-wires can be relatively large, which limits the magnetic coupling of wires.

For different signals processed using impedance-based circuits, problems can result from this mutual coupling between signals, and other issues as discussed above.

In connection with various example embodiments, an input circuit provides power to main and peak amplifiers, in a manner that addresses challenges for a variety of applications and devices, such as those discussed above.

In connection with an example embodiment, an inductive circuit splits an input signal into two output signals. The circuit includes an input terminal that receives an input signal, and a first inductive circuit including a pair of bond wires coupled to the input terminal and extending to a first output terminal to provide a first output signal. A second inductive circuit includes a bond wire extending from an intermediate input terminal to a second output terminal to provide a second output signal. The bond wires extend in a parallel direction and are offset from one another to mitigate magnetic coupling between the bond wires. A capacitive circuit couples the intermediate input terminal to the first output terminal, and another capacitive circuit couples the input terminal to the second output terminal.

In connection with another example embodiment, a radio frequency amplifier circuit includes a laterally diffused metal oxide semiconductor (LDMOS) substrate, a main amplifier circuit, a peak amplifier circuit and an inductive input circuit. The inductive input circuit includes an input terminal that receives an input signal, and a first inductive circuit including a pair of bond wires coupled to the input terminal and extending to a first output terminal, to provide a first output signal to the peak amplifier circuit. A second inductive circuit includes a bond wire extending from an intermediate input terminal to a second output terminal, and provides a second output signal to the main amplifier circuit via the second output terminal. Each of the respective terminals is located on the LDMOS substrate, and the bond wires extend in a parallel direction and are offset from one another in order to mitigate magnetic coupling between the bond wires and further to mitigate passage of the input signal via the LDMOS substrate. A capacitive circuit couples the intermediate input terminal to the first output terminal, and another capacitive circuit couples the input terminal to the second output terminal.

In connection with other example embodiments, an input signal is split into two output signals. The input signal is provided to an input terminal, and the input signal is passed to a first output terminal via a first inductive circuit including a pair of bond wires that are coupled to the input terminal and that extend to the first output terminal, to provide a first output signal. The signal at the first output terminal is coupled to an intermediate input terminal via a capacitive circuit. The signal at the intermediate input terminal is coupled to a second output terminal, via a second inductive circuit including a bond wire extending from the intermediate input terminal to the second output terminal, to provide a second output signal. The bond wires extend in a parallel direction and offset from one another, and are used to mitigate magnetic coupling between the bond wires. The input signal at the input terminal is also coupled to the second output terminal via a capacitive circuit.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
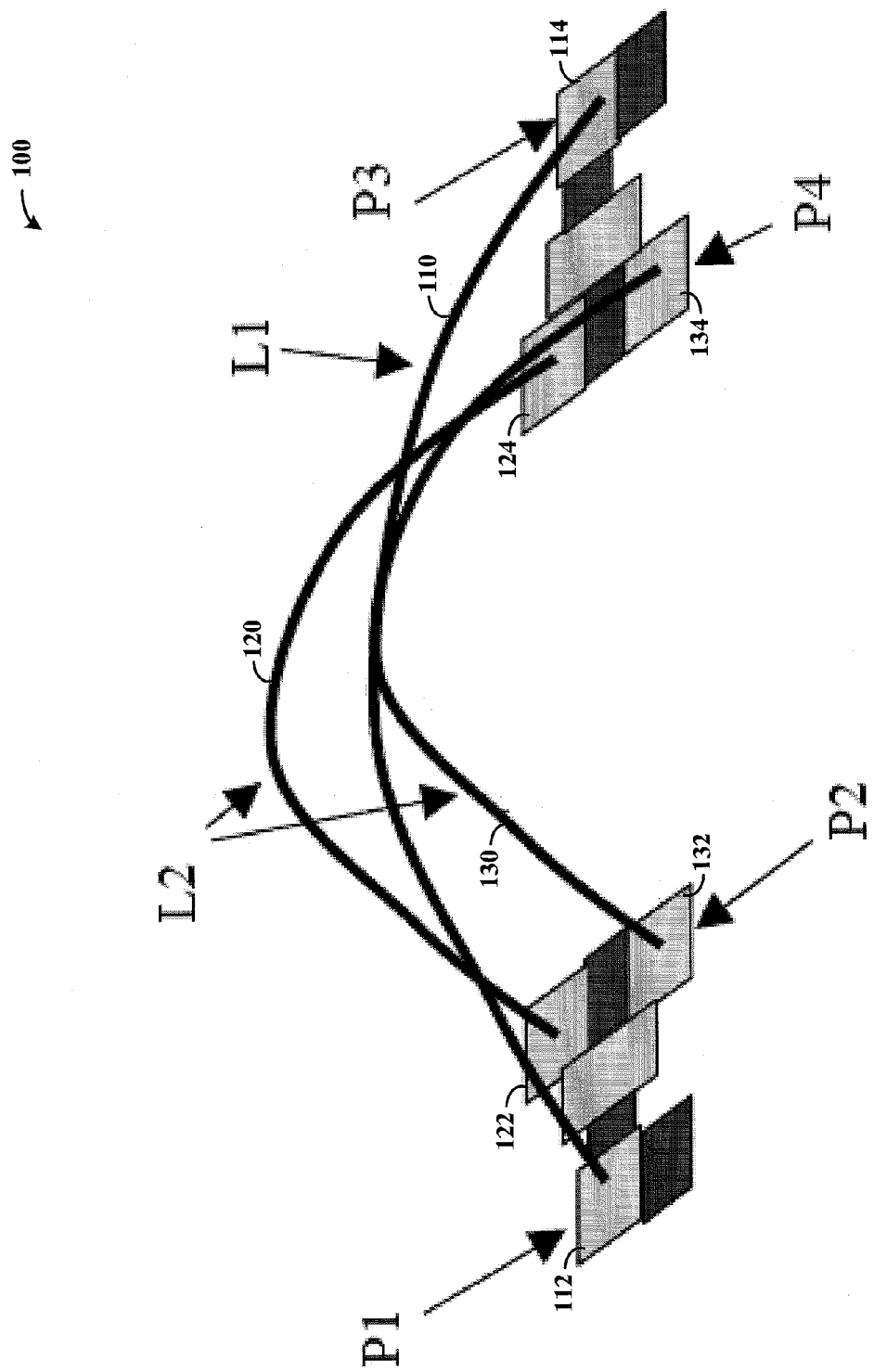
FIG. 1 shows a bond wire arrangement, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of processes, devices and arrangements for use with various circuits, including inductive circuits for amplifiers, as well as various applications of these circuits such as those involving wireless communications and radio frequency (RF)/microwave signals. While the present invention is not necessarily so limited, various aspects of the invention may be appreciated through a discussion of examples using this context.

In connection with various example embodiments, a bond wire arrangement includes interacting wires that are positioned relative to one another to set and/or mitigate the magnetic coupling of the wires. In one implementation, three wires are arranged with one wire generally between the other two wires. Relative placement of the wires can be used to mitigate performance deviations based upon distances between wires.

In many applications, RF power splitting networks using bond wires are arranged on one or more substrates such as those including a Si LDMOS (or similar) type of substrate, and used as part of a power input splitter for an amplifier circuit, such as an RF amplifier circuit having two amplifiers or devices. These devices can be connected in parallel with input signal phase differences, such as 0, 180 or 90 degrees, as also in a Doherty amplifier having main and peak amplifiers. The respective wires can be arranged in different manners, to achieve required power division in frequency band with certain isolation levels between all ports, and to do so while mitigating loss of RF signal, such as by limiting the RF loss to less than about 0.3 dB to 0.5 dB. For general information regarding Doherty amplifiers, and for specific information regarding such amplifiers and approaches to which various example embodiments may be applied, reference may be made to U.S. Pat. No. 7,078,976, which is fully incorporated herein by reference.

To achieve such a level of RF power losses, the components may be arranged to exhibit a high quality factor Q (e.g., above 80 or 100). Bond wires are used to facilitate a quality factor Q that is greater than about 80 in the frequency band up to about 10 GHz, as arranged above a ground plane or metal surface having high conductivity, as may further be applicable to MIM capacitances exhibiting relatively low (e.g., <0.2 dB) signal loss. Such an application can be used with MMIC (Monolithic Microwave Integrated Circuit) Technology, such as with a transceiver of a wireless system or other radio frequency (RF) system.

The respective distances between the wires are set in accordance with a particular application in which the wires are to be used. In one implementation, the wires are placed in close proximity, using the magnetic coupling of the different wires to mitigate variations in overall capacitance relative, for example, to capacitance variations exhibited by fewer wires or a single such wire. Sufficient magnetic coupling to effect this mitigation may be set/selected at various levels depending upon the implementation, such as at a level that is at least about 0.4 or greater. In some implementations, the bond wires exhibit a desirable magnetic coupling factor (k) of between about 0.6 and 0.707 for parallel bond wires spaced at about 60 µm apart. This degree of coupling may be set based upon the ability of the manufacturing process to place the wires in proximity to one another and/or the type of underlying substrate.

According to another example embodiment of the present invention, a bond wire circuit includes one or more sets of bond wires extending in a generally common direction relative to other bond wires within each set, with each bond wire spaced relative to other bond wires within the set in which the bond wire resides. In many applications, each bond wire extends between a pair of circuit terminals, and the respective pairs of circuit terminals in each set are arranged in a generally linear direction, relative to other pairs of circuit terminals in the set (e.g., lines connecting the pairs of terminals within each set are within several degrees of parallel). The corresponding bond wires connecting the terminals thus extend in a common direction, which can be used to facilitate coupling along some or all of the length of the bond wires.

The arrangement of the terminals and bond wires connecting them can be adjusted, relative to one another, to increase or decrease magnetic coupling between the wires. In some applications, setting the magnetic coupling involves setting the position of the pairs of terminals relative to other pairs of terminals. For instance, by placing the terminals closer to one another, the bond wires can also be placed closer to one another, near their respective connections to the terminals. Similarly, by rearranging terminals for different bond wires, the bond wires connected to the respective terminals may be crossed, intertwined or otherwise arranged relative to one another to mitigate magnetic coupling.

In other applications, setting the magnetic coupling involves adjusting the bond wires relative to one another, as they extend between the terminals. For instance, the bond wires may be arched higher or lower than other wires, or bent laterally closer to or further from one another. In still other applications, the position of the terminals and the arrangement of the bond wires are both manipulated to set the magnetic coupling.

The bond wire arrangement can be used to split input power for a variety of amplifiers. As discussed above, some embodiments are directed to a hybrid power input splitter circuit for main and peak amplifiers for an RF amplifier circuit. One such application involves the use of a Doherty amplifier having a Silicon LDMOS (laterally-diffused metal oxide semiconductor) substrate. For general information regarding amplifiers, and for specific information regarding amplifiers and Doherty-type amplifiers with which one or more embodiments herein may be implemented as an input power splitter, reference may be made to U.S. Patent Publication No. 2009/0212858 to Blednov, which is fully incorporated herein by reference.

Various applications as discussed herein are implemented with a Doherty amplifier, which achieves high linear efficiency by having a first amplifier (main amplifier or carrier amplifier) operated so that the output begins to saturate and high linear efficiency is obtained. A second (peak or auxiliary) amplifier is used to maintain overall linearity as the output is driven beyond this saturation point. The Doherty amplifier's operation can thus be divided into two main regions. In the first region, the input power is less than the peak amplifier's threshold and the carrier amplifier supplies the output power to the load. As the input drive voltage or power increases further to a level just before the carrier amplifier becomes saturated (the point where the peak efficiency is obtained), the peak amplifier starts to operate, beginning the second region of operation.

Through the connection of a quarter-wave transformer, the power supplied by the peak amplifier effectively reduces the output load impedance seen by the carrier amplifier. This impedance reduction enables the carrier amplifier to deliver more power to the load while its voltage remains saturated. In this way, desired efficiency of the carrier (or main) amplifier and hence of the overall Doherty amplifier is maintained throughout the region until the peak amplifier reaches its saturation.

In another more particular example embodiment, a mobile communications base station amplifier circuit includes a bond wire circuit as discussed herein, for supplying (split) power to lumped-hybrid input circuit for main and peak amplifiers, with desirable amplitude/power difference, and an about constant 90 degree phase shift in wide frequency band, enabling 30% relative operational Doherty bandwidth.

In many implementations, impedance transformers are removed from a Doherty amplifier architecture by integrating the Doherty amplifier, in which a Doherty combiner can be connected directly to the output of a main device without impedance transformation networks in between. This is effected by setting the characteristic impedance of a Doherty combiner to a value that is about equal to an expected/desirable load impedance of the main device, which can be done using a Doherty combiner of lumped element integrated components, to achieve an operational frequency band of 30%.

In connection with various embodiments, the term orthogonal is used to refer to the orientation of bond wires or sets of bond wires. This term may be applicable, for example, to bond wires that extend in planes that are at or near perpendicular to one another (e.g., within several degrees of being perpendicular). The term parallel is also used to refer to orientation in connection with various embodiments, including the orientation of bond wires in a loop. This term may be applicable to bond wires extending in parallel planes, or in planes that are near parallel (e.g., within several degrees of parallel).

The amplifiers as discussed herein and/or shown in the figures may be implemented using a variety of different types of devices, such as a bipolar power device, MOS (Metal Oxide Semiconductor), LDMOST (Lateral Defused Metal Oxide Semiconductor Transistor), FET (Field Effect Transistor), PHEMT or HBT (Heterojunction Bipolar Transistor). The LDMOST provides high gain and good linearity, and can be implemented with complex modulation schemes such as WCDMA, with a Doherty type amplifier arrangement. For example, HBT MMIC power devices may be used, where the heterojunction increases breakdown voltage and minimizes leakage current between junctions.

Turning now to the figures, FIG. 1 shows a bond wire arrangement 100, in accordance with another example embodiment of the present invention. The bond wire arrangement 100 includes three bond wires 110, 120 and 130 arranged in a generally parallel direction. The interior bond wire 110 is flanked by bond wires 120 and 130 on opposing sides, with the arrangement of all three wires facilitating desirable magnetic coupling between the bond wires, for providing a split input signal for one or more of a variety of purposes, such as amplification.

Bond wire 110 is coupled between terminals 112 and 114, bond wire 120 is coupled between terminals 122 and 124, and wire 130 is coupled between terminals 132 and 134. Effectively, bond wire 110 provides a first inductance L1, and bond wires 120/130 provide a second inductance L2. RF signals travelling in the bond wires are influenced by magnetic coupling between the respective wires, in a manner that is controlled (or mitigated) as discussed above.

The respective terminals can be coupled to part of a hybrid input circuit for supplying (split) input signals to amplifiers. Accordingly, the terminals may be connected to nodes P1, P2, P3 and P4 as discussed further below in connection with FIGS. 2A-2D; the bond wire arrangement 100 is thus arranged with circuits as shown in these figures, in accordance with various example embodiments.

Figure 2A:
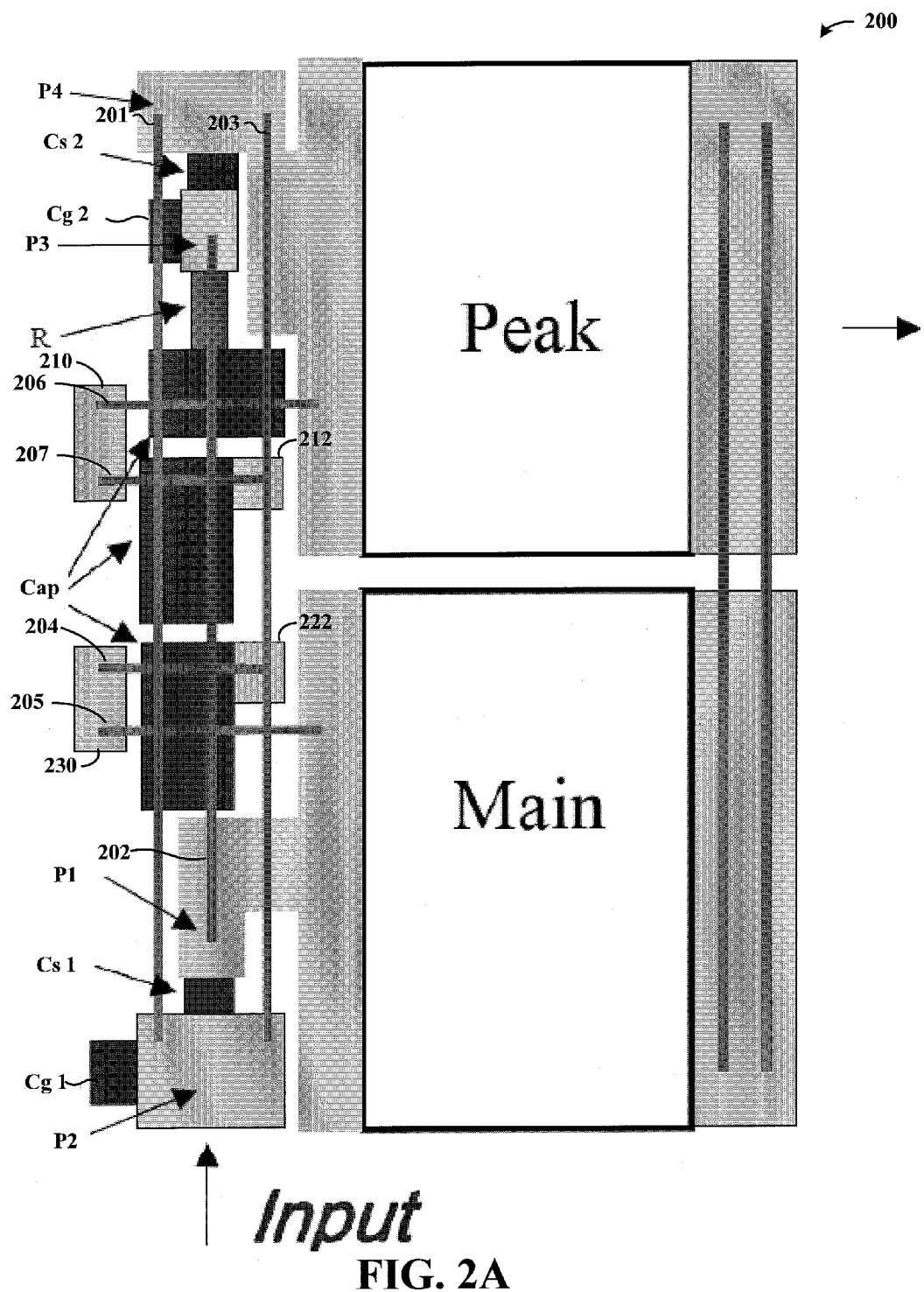
FIG. 2A shows a semiconductor-based amplifier circuit having an inductive bond wire arrangement, according to another example embodiment of the present invention.

FIG. 2A shows a semiconductor-based amplifier circuit having an inductive bond wire arrangement, according to another example embodiment of the present invention. The respective nodes P1, P2, P3, and P4 are connected by bond wires 201, 202 and 203 arranged generally parallel, relative to one another. The bond wires may, for example, be arranged as shown in the bond wire circuit 100 of FIG. 1.

Power is input at terminal P2, which is connected to both bond wires 201 and 203. Terminals P1 and P4 are respectively coupled to main and peak amplifiers and terminal P3 is coupled to a resistive load R. Terminals P1 and P2 are connected by capacitor Cs1, and terminals P3 and P4 are connected by capacitor Cs2. Terminals P2 and P3 are respectively coupled to capacitors Cg1 and Cg2 (and to ground/reference). Other connectivity as shown in FIG. 2A can be implemented in connection with the examples shown in and described in connection with FIGS. 2B-2D below. For instance, parallel bond wire sets 204/205 and 206/207 can effect an inductive coupling circuit between main and peak amplifiers and ground 271 (via capacitors), as shown with circuits 262 and 272 in FIG. 2C.

Figure 2B:
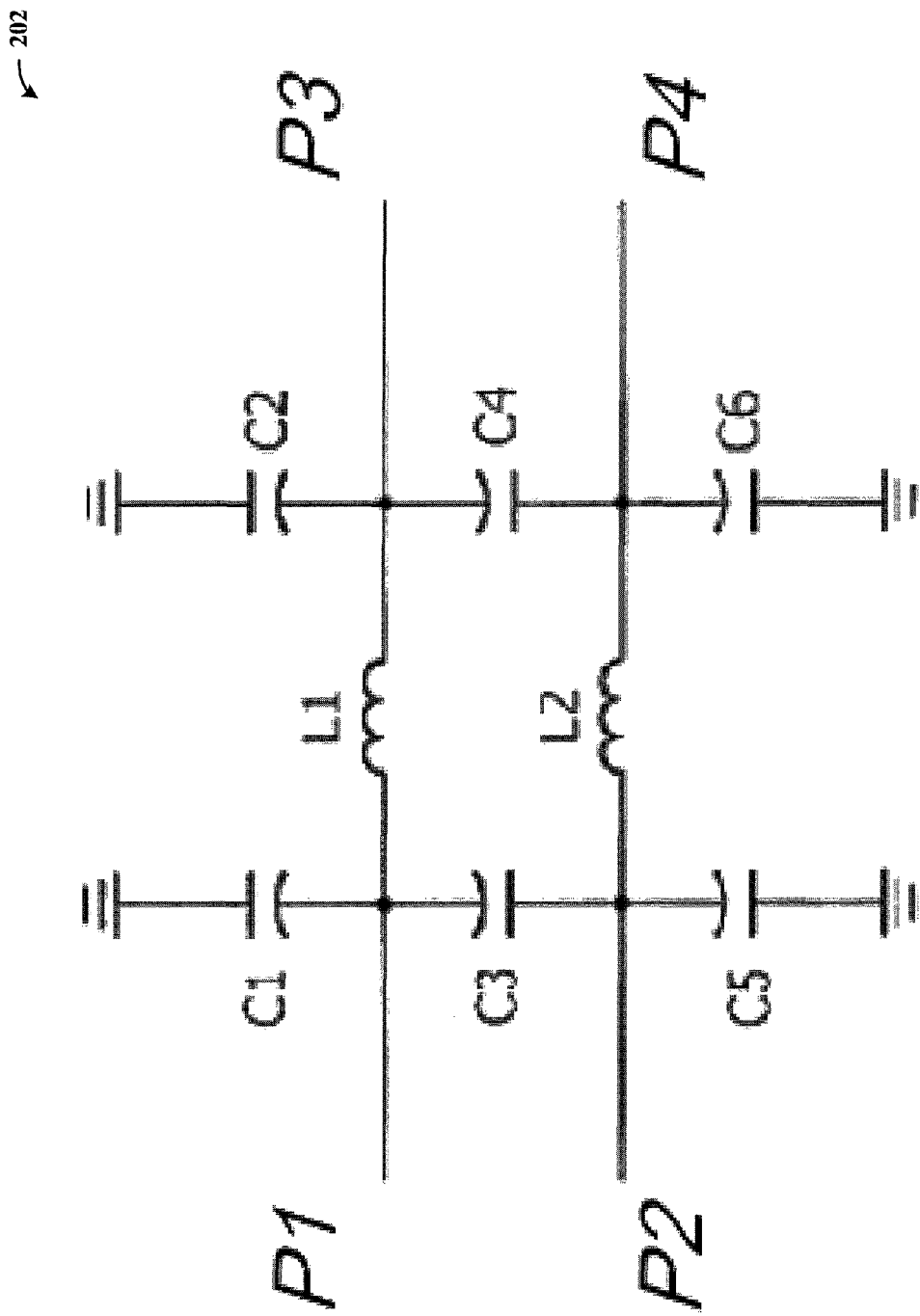
FIG. 2B shows a lumped-circuit element for an amplifier circuit such as shown in FIG. 2A, according to another example embodiment of the present invention.

FIG. 2B shows a lumped-circuit element 202 for an amplifier circuit such as shown in FIG. 2A, according to another example embodiment of the present invention. Parallel capacitors C3 and C4 are respectively connected between ports P1/P2 and ports P3/P4. One of the ports (e.g., P3) can be used as a termination port to which an external load is connected to absorb power reflected from output ports in case of impedance mismatch and facilitating isolation between ports. Another port (e.g., P2) can be used as a signal input port. The capacitors C3 and C4 are connected in parallel to the two input-side ports and the two output-side ports are respectively connected at their upper ends via a first serial inductor L1, and at their lower ends via a second serial inductor L2. Each port is connected via parallel capacitors C1, C2, C5 and C6 to ground or any other suitable reference potential. With this configuration, it is possible to provide an arbitrary, specifically non-equal, power division at the first and second output ports while the phase shift between the output signals at the two output ports remains constant at 90° over a wide frequency range. Moreover, a high isolation between the two output ports can be achieved also over a wide frequency range. Power division between main and peak amplifiers is thus provided, while input reflection losses can be kept low.

Figure 2C:
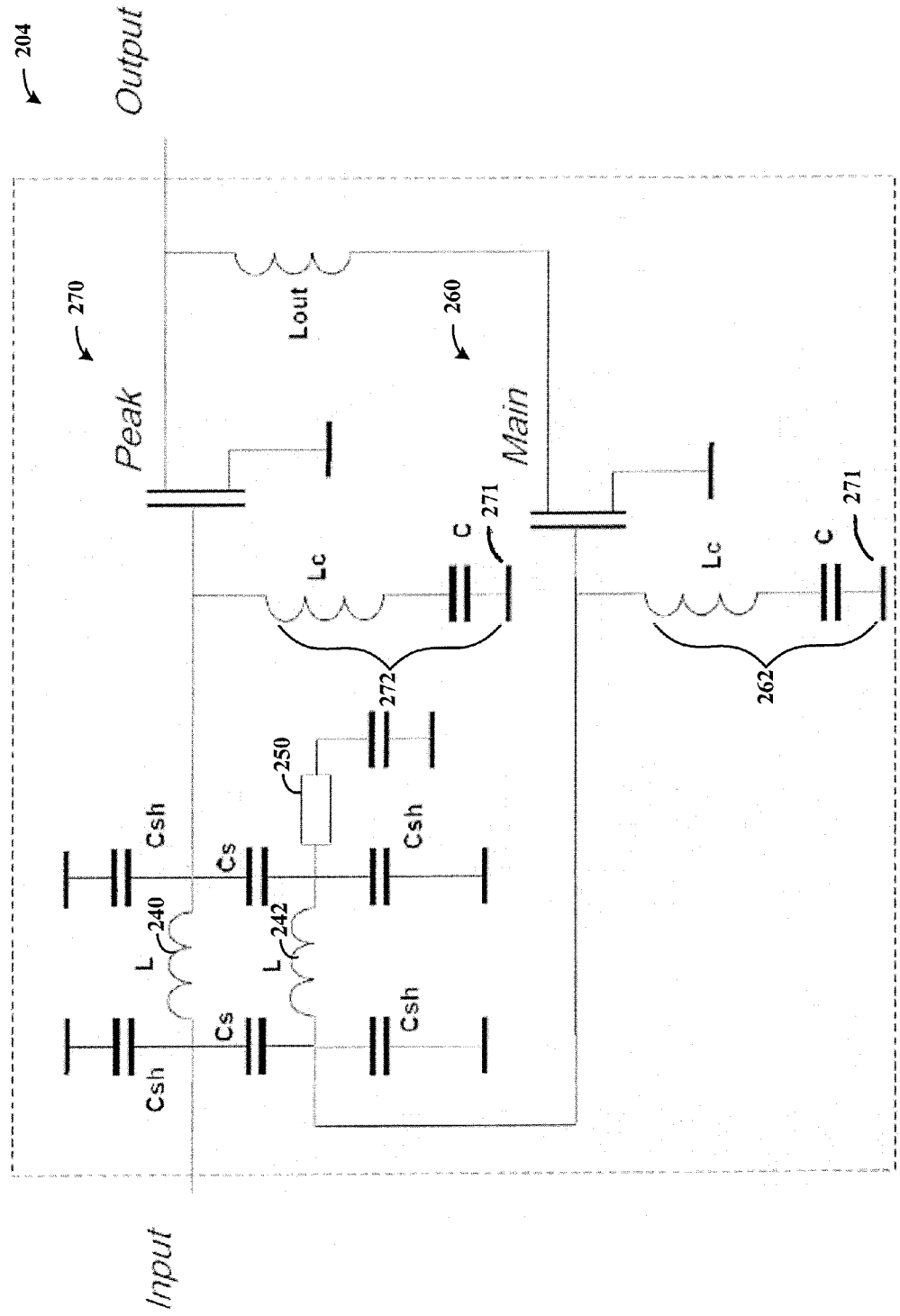
FIG. 2C shows a schematic for a semiconductor-based amplifier circuit having an inductive bond wire arrangement, as may be implemented with FIG. 2A and the lumped-circuit element shown in FIG. 2B, according to another example embodiment of the present invention.

FIG. 2C shows a schematic semiconductor-based amplifier circuit 204 having an inductive bond wire arrangement, as may be implemented with the circuit 200 shown in FIG. 2A and/or with the lumped-circuit element 202 shown in FIG. 2B, according to another example embodiment of the present invention. The circuit 204 has two inductance circuits 240 and 242 collectively including bond wires arranged to mitigate magnetic coupling (e.g., as shown in FIG. 1), coupled by capacitors Cs and also having respective ends thereof coupled by (shunt) capacitors Csh. A load 250 is coupled to the inductance circuit 242.

An input signal received at inductance circuit 242 is split and provided to main and peak amplifier circuits 260 and 270. Each of the amplifiers is further coupled to ground or a suitable reference potential via circuits 262 and 272, respectively.

Figure 2D:
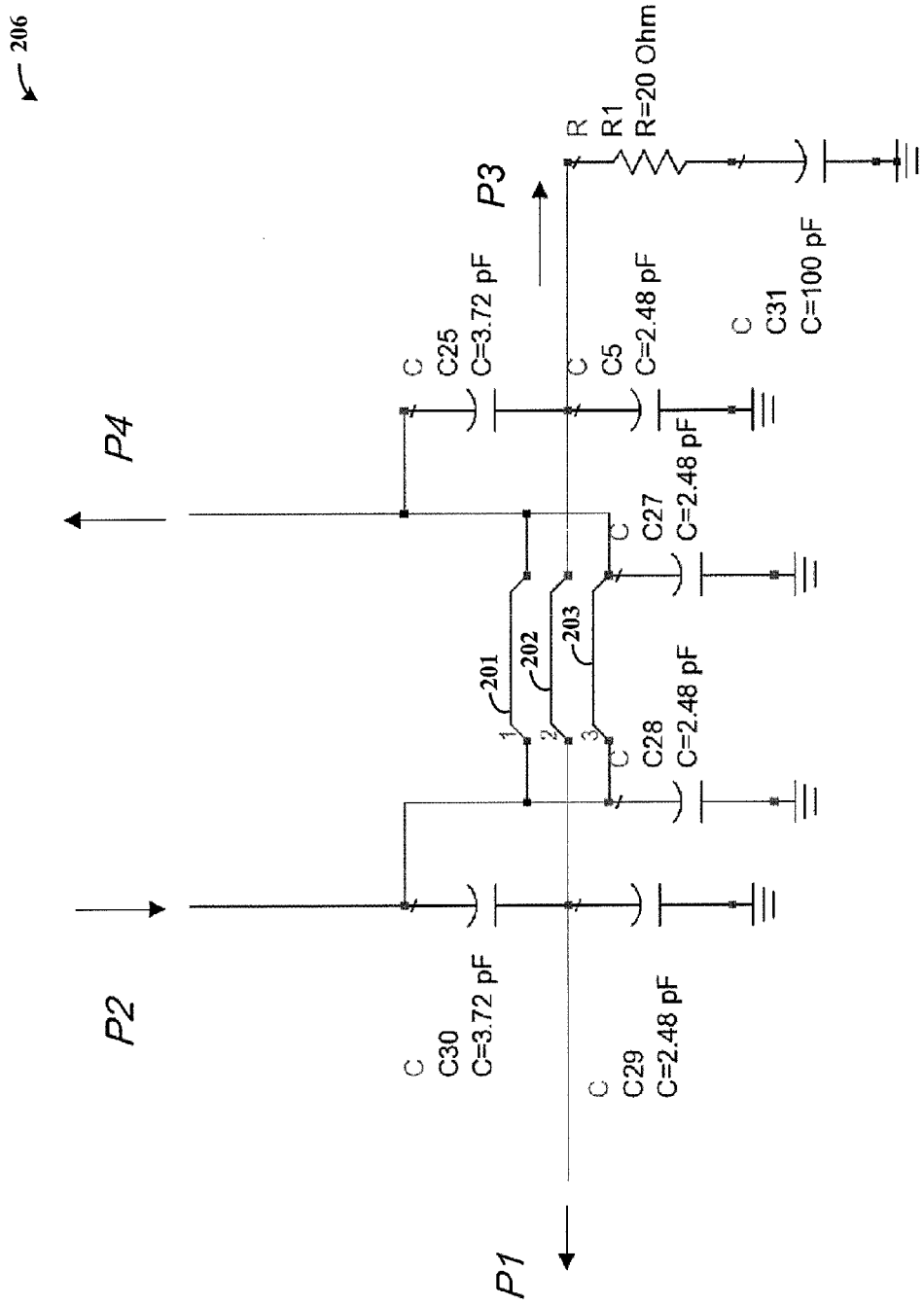
FIG. 2D shows a schematic of lumped element power splitting circuit, as may be implemented with the circuit 200 shown in FIG. 2A, according to another example embodiment of the present invention.

FIG. 2D shows an integrated LDMOS power amplifier circuit 206, as may be implemented with the circuit 200 shown in FIG. 2A, according to another example embodiment of the present invention. To facilitate discussion, certain circuit components shown in FIG. 2D are labeled similarly to those shown in FIG. 2A by way of example, with the understanding that the circuit 206 can be implemented with other types of circuits as well. The specific capacitances shown are exemplary, for use in connection with specific embodiments.

A signal is input at terminal P2, split and provided to amplifiers. Terminal P4 is coupled to a load R1, such as to relieve the power dissipation constraint. Three bond wires 201, 202 and 203 are connected to the terminals and respective capacitive and resistive circuits as shown. The input ends of bond wires 201 and 203 are coupled to receive an input signal at terminal P2, to ground/reference via capacitor C28, and further coupled to the output end of bond wire 202 via capacitor C30 at terminal P1, which is further coupled to ground/reference via capacitor C29. The output ends of bond wires 201 and 203 are coupled to output terminal P4 (e.g., to an amplifier), ground/reference via capacitor C27, and to the input end of bond wire 202 via capacitor C25 at terminal P4, which is further coupled to ground/reference via capacitor C5.

Figure 3:
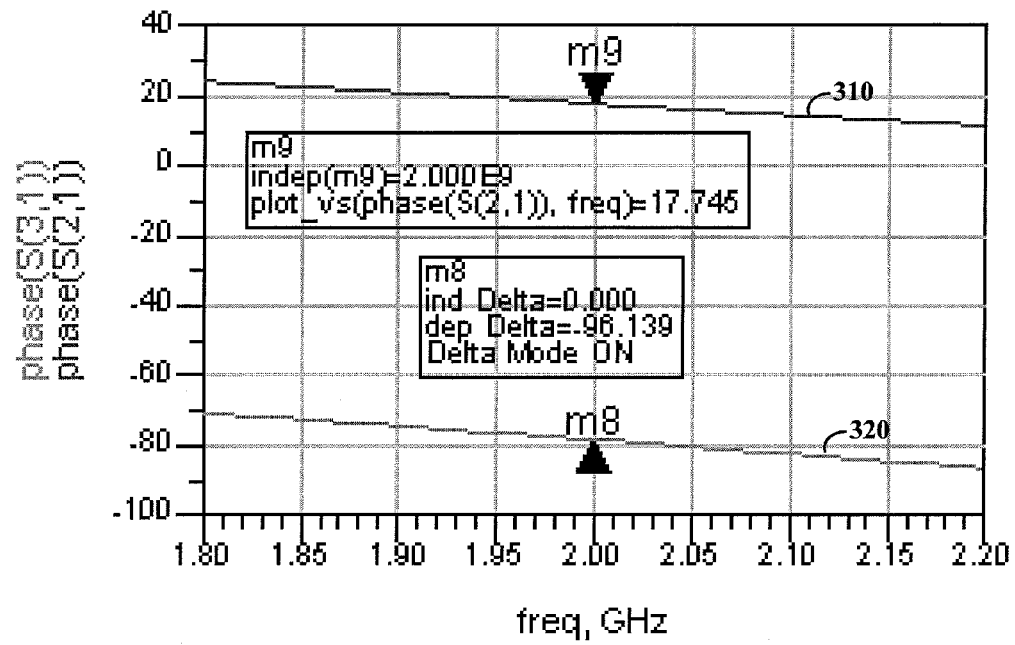
FIG. 3 is a plot showing phase differences between signals split in a circuit (e.g., as shown in FIG. 2D), according to another example embodiment of the present invention.
Figure 4:
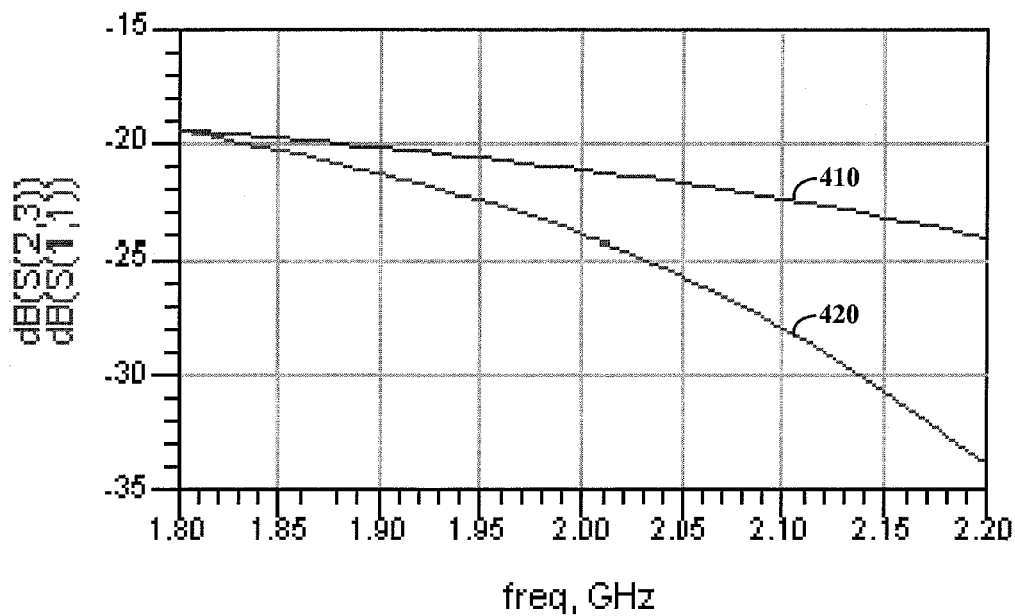
FIG. 4 is a plot showing isolation between output ports in a frequency band as operational characteristics of a circuit (e.g., as shown in FIG. 2D), according to another example embodiment of the present invention.
Figure 5:
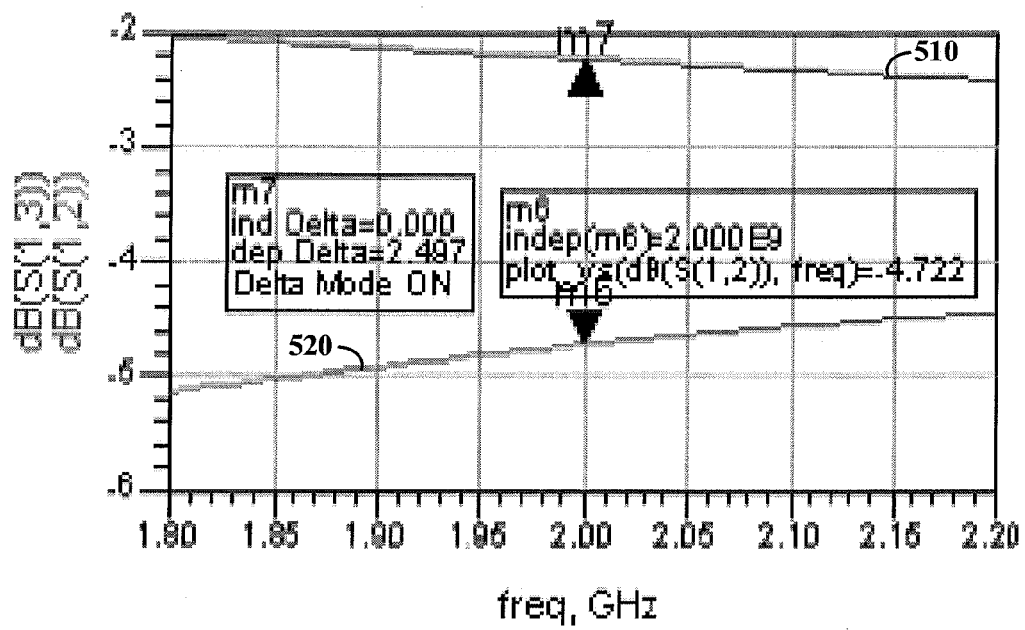
FIG. 5 is a plot showing power division between output ports in a frequency band as operational characteristics of a circuit (e.g., as shown in FIG. 2D), according to another example embodiment of the present invention.
Figure 6:
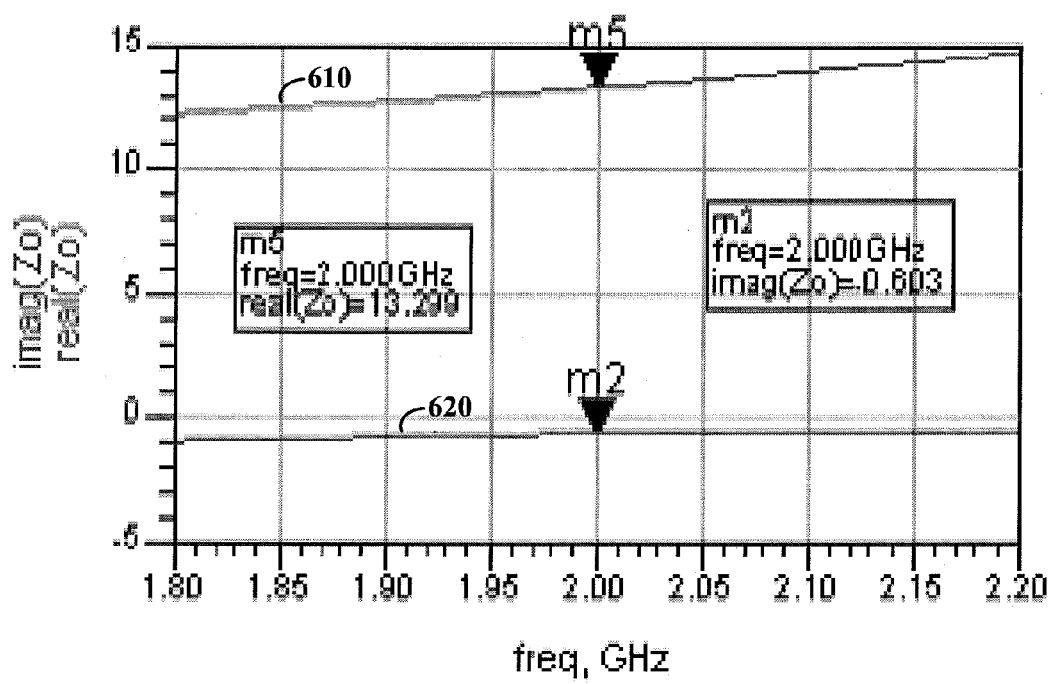
FIG. 6 is a plot showing real and imaginary impedance for a circuit (e.g., as shown in FIG. 2D), according to another example embodiment of the present invention.

FIGS. 3-6 respectively show phase frequency response, input return loss, power division ratio, isolation between ports and input impedance of a bond wire power splitting network in the frequency band. FIG. 3 is a plot showing phase differences between signals that are split and delivered in an amplifier circuit, with the phases of each signal 310 and 320 as provided to respective amplifiers being about 90 degrees out of phase, relative to one another. FIG. 4 shows input and mutual port isolation characteristics of a bond wire power splitting network, such as shown in the figures and described herein, in (dB) over a frequency range. FIG. 5 shows power split ratio between output ports 510 and 520 (for respective ports and amplifiers). FIG. 6 is a plot showing real (610) and imaginary (620) impedance for an input power splitting network and Doherty amplifier circuit, according to another example embodiment of the present invention.

Based upon the above discussion and illustrations, those skilled in the art will readily recognize that various modifications and changes may be made to the present invention without strictly following the exemplary embodiments and applications illustrated and described herein. For example, the bond wires as shown and discussed may be replaced with bond wires of different size, thickness or shape. The bond wires can also be implemented with different types of hybrid circuits, and with different types of amplifier circuits, which may include additional amplifiers (e.g., additional peak amplifiers to accompany a main amplifier). The loop circuits as discussed herein may also be implemented in connection with a multitude of disparate devices, including those having amplifiers, radio-frequency circuits and others. Such modifications do not depart from the true spirit and scope of the present invention, including that set forth in the following claims.

What is claimed is:

1. An inductive circuit for splitting an input signal into two output signals, the circuit comprising:
   an input terminal that receives an input signal;
   a first inductive circuit including a pair of bond wires coupled to the input terminal and extending to a first output terminal to provide a first output signal;
   a second inductive circuit including a bond wire extending from an intermediate input terminal to a second output terminal to provide a second output signal, the bond wires extending in a parallel direction and offset from one another to mitigate magnetic coupling between the bond wires;
   a capacitive circuit coupling the intermediate input terminal to the first output terminal; and
   a capacitive circuit coupling the input terminal to the second output terminal.

2. The circuit of claim 1, wherein the inductive and capacitive circuits are configured to split the input signal into the first and second output signals by splitting the input signal into output signals that are offset from one another by a predetermined phase shift.

3. The circuit of claim 1,
   wherein the bond wires are configured to facilitate mutual magnetic coupling and mitigate the passage of the input signal.

4. The circuit of claim 1, further including:
   a substrate in contact with the terminals, and
   insulative material on the substrate and arranged to electrically insulate the terminals from one another.

5. The circuit of claim 1, further including a laterally diffused metal oxide semiconductor (LDMOS) substrate, the respective terminals and capacitive circuits being coupled to the LDMOS substrate.

6. The circuit of claim 1, further including capacitive circuits respectively coupled to ends of the respective bond wires and at least one of a ground plane or reference voltage plane.

7. The circuit of claim 1, further including a resistive load circuit coupled to the intermediate input terminal to dissipate power reflected from the output terminals.

8. The circuit of claim 1, wherein the bond wires in each of the first and second inductive circuits are respectively configured to provide a mutual magnetic coupling between the first and second inductive circuits in a selected frequency band.

9. The circuit of claim 1, wherein the respective terminals, capacitors and bond wires are configured to receive, split in two portions and pass radio frequency (RF) signals to the output terminals at selected impedances with a predetermined phase difference in a particular frequency band.

10. The circuit of claim 1, wherein the output terminals are respectively connected to input terminals of main and peak amplifier circuits.

11. The circuit of claim 1, further including:
    first and second amplifiers respectively coupled at their inputs to the first and second output terminals, and
    an output circuit coupled to the amplifiers, the output circuit including at least two bond wires that are substantially parallel to one another and respectively couple output terminals of the amplifiers with one another.

12. The circuit of claim 1, further including
    first and second amplifiers respectively coupled to the first and second output terminals, and
    capacitive circuits coupled between the inputs of each amplifier and at least one of a reference voltage plane of an underlying substrate.

13. The circuit of claim 1, further including
    first and second amplifiers respectively coupled to the first and second output terminals, and
    for each amplifier,
    a capacitive circuit, and
    a pair of bond wires extending in a parallel direction relative to one another, a first one of the bond wires coupled to the input of the amplifier and to an intermediate capacitive circuit terminal, and a second one of the bond wires coupled to the intermediate capacitive circuit terminal and the capacitive circuit, the bond wires being configured and arranged to mutually magnetically couple to one another.

14. A radio frequency amplifier circuit comprising:
    a laterally diffused metal oxide semiconductor (LDMOS) substrate;
    a main amplifier circuit;
    a peak amplifier circuit;
    an input terminal that receives an input signal;
    a first inductive circuit including a pair of bond wires coupled to the input terminal and extending to a first output terminal to provide a first output signal to an input of the peak amplifier circuit;
    a second inductive circuit including a bond wire extending from an intermediate input terminal, to a second output terminal to provide a second output signal to an input of the main amplifier circuit;
    the respective terminals being located on the LDMOS substrate;
    the bond wires extending in a parallel direction and offset from one another to mitigate magnetic coupling between the bond wires;
    a capacitive circuit coupling the intermediate input terminal to the first output terminal; and
    a capacitive circuit coupling the input terminal to the second output terminal.

15. The circuit of claim 14, further comprising a resistive circuit coupling the intermediate input terminal to at least one of a reference voltage plane and a conductive substrate.

16. The circuit of claim 14, further including capacitive circuits respectively coupling the input terminals to a reference voltage plane and a conductive substrate.

17. The circuit of claim 14, further comprising
   at least one of an underlying reference voltage plane and a conductive substrate,
   a resistive circuit coupling the intermediate input terminal to the at least one of an underlying reference voltage plane and a conductive substrate, and
   capacitive circuits respectively coupling the input terminals to the at least one of an underlying reference voltage plane and a conductive substrate.

18. The circuit of claim 14, wherein each of the first and second inductive circuits are respectively configured to provide a sufficient level of magnetic coupling between the bond wires of each respective inductive circuit to mitigate variances in capacitance of the bond wires.

19. A method for splitting an input signal into two output signals, the method comprising:
   providing an input signal to an input terminal;
   passing the input signal to a first output terminal via a first inductive circuit including a pair of bond wires coupled to the input terminal and extending to the first output terminal, to provide a first output signal;
   coupling the signal at the first output terminal to an intermediate input terminal via a capacitive circuit;
   coupling the signal at the intermediate input terminal to a second output terminal, via a second inductive circuit including a bond wire extending from the intermediate input terminal to the second output terminal, to provide a second output signal, the bond wires extending in a parallel direction and offset from one another to mitigate magnetic coupling between the bond wires; and
   coupling the input signal at the input terminal to the second output terminal via a capacitive circuit.

20. The method of claim 19, further including using the signal passed in the bond wires of the first inductive circuit to induce a current in the bond wire of the second inductive circuit, and using the signal passed in the bond wire of the second inductive circuit to induce a current in the bond wires of the first inductive circuit, and compensating for frequency-dependent current amplitudes of the signals using capacitive networks connected between the bonded ends of the bond wire sets.

21. The method of claim 19,
   the metal plate being connected to a ground plane terminal at the first input port of an MMIC amplifier, to grounded plates of the capacitive circuits, and to external source terminals of an active structure of a FET/LDMOS device, and
   further including returning current of the input signal between active device inputs and the MMIC input port.

22. An inductive circuit for splitting an input signal into two output signals, the circuit comprising:
   an input terminal that receives an input signal;
   a first inductive circuit including a pair of bond wires coupled to the input terminal and extending to a first output terminal to provide a first output signal;
   a second inductive circuit including a bond wire extending from an intermediate input terminal to a second output terminal to provide a second output signal, the bond wires extending in a parallel direction and offset from one another to mitigate magnetic coupling between the bond wires, wherein the bond wires in each of the first and second inductive circuits are respectively configured to facilitate a mutual magnetic coupling between the first and second inductive circuits in a selected frequency band;
   a capacitive circuit coupling the intermediate input terminal to the first output terminal; and
   a capacitive circuit coupling the input terminal to the second output terminal, wherein the inductive and capacitive circuits are configured to split the input signal into the first and second output signals by splitting the input signal into output signals that are offset from one another by a predetermined phase shift.

* * * * *